United States Patent
Hu et al.

(10) Patent No.: US 7,867,823 B2
(45) Date of Patent: Jan. 11, 2011

(54) METHOD FOR FABRICATING A SEMICONDUCTOR PACKAGE

(75) Inventors: Kunzhong Hu, Santa Monica, CA (US); Chuan Cheah, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 508 days.

(21) Appl. No.: 11/713,893

(22) Filed: Mar. 5, 2007

(65) Prior Publication Data

US 2007/0212822 A1    Sep. 13, 2007

Related U.S. Application Data

(60) Provisional application No. 60/779,924, filed on Mar. 7, 2006.

(51) Int. Cl.
*H01L 21/00* (2006.01)

(52) U.S. Cl. .......... 438/108; 438/612; 438/613; 438/614; 257/E21.511

(58) Field of Classification Search .......... 438/108, 438/612, 613, 614; 257/E21.511
See application file for complete search history.

(56) References Cited

U.S. PATENT DOCUMENTS

| 6,165,885 A * | 12/2000 | Gaynes et al. | 438/612 |
| 6,228,681 B1 * | 5/2001 | Gilleo et al. | 438/108 |
| 2004/0169275 A1 * | 9/2004 | Danvir et al. | 257/737 |
| 2007/0284758 A1 * | 12/2007 | Zhang et al. | 257/780 |

* cited by examiner

*Primary Examiner*—Jarrett J Stark
*Assistant Examiner*—John M Parker
(74) *Attorney, Agent, or Firm*—Farjami & Farjami LLP

(57) ABSTRACT

A method for fabricating an IC package that includes depositing conductive adhesive bodies on the leads, and then adhering the electrodes of an IC device to the so disposed conductive adhesive bodies.

21 Claims, 3 Drawing Sheets

METHOD FOR FABRICATING A SEMICONDUCTOR PACKAGE

RELATED APPLICATION

This application is based on and claims priority to the U.S. Provisional Application Ser. No. 60/779,924, filed on Mar. 7, 2006, entitled No Bumping Flip IC Package, to which a claim of priority is hereby made and the disclosure of which is incorporated by reference.

BACKGROUND OF THE INVENTION

Referring to FIGS. 1 and 2, a semiconductor package according to the prior art includes an integrated circuit (IC) semiconductor device 10, a plurality of leads 12 arranged around device 10, a plurality of wirebonds 14 each electrically coupling a respective lead 12 to a respective electrode of device 10, a die pad 16 supporting device 10, and molded housing 18 (depicted using slanted lines in FIGS. 1 and 3) molded over device 10, wirebonds 14, and at least portions of leads 12, and die pad 16.

Referring now to FIGS. 3 and 4, a package according to another prior art concept includes all of the elements of the package illustrated by FIGS. 1 and 2, except that device 10 is connected to leads 12 through solder bumps 20. The solder bumps serve to reduce the resistance of the package compared to wirebonding. Moreover, as is readily seen, solder bumps allow the device 10 to be supported on leads 12, obviating the need to provide a die pad 16.

To realize a package as depicted by FIGS. 3 and 4, device 10 must "bumped" with solder bumps or other bumps prior to disposition on leads 12. The bumping process is expensive and complex.

It is desirable to avoid the bumping process or pre-soldering process and yet take advantage of flip-mounting of a device onto leads.

SUMMARY OF THE INVENTION

In a method according to the present invention, an IC semiconductor device is flip-mounted on a plurality of leads or laminate substrate, or ceramic substrate without bumping the device first. As a result, the process for fabricating an IC package or FLIP-CHIP package, or MCM package is less expensive.

Specifically, in order to eliminate the need for solder-bumping a passivation body is formed over a surface of the IC semiconductor device. The passivation body so formed includes an opening over each electrode of the IC semiconductor device. Thereafter, a conductive adhesive body such as solder or a conductive epoxy is disposed on the leads of a lead frame or the pads of a substrate, and the IC semiconductor device is flip-mounted by first aligning each opening of the passivation body with a respective conductive adhesive body. Thereafter, the adhesive body is adhered to the electrodes of the IC semiconductor device in an appropriate step.

The passivation body is selected to have a characteristic to prevent the spreading of the conductive adhesive during the adhering process in order to avoid shorting of the electrodes of the IC semiconductor device. Thus, preferably the passivation body exhibits solder resist characteristics.

Forming a passivation body on a wafer containing a plurality of IC semiconductor devices is much easier and less expensive than bumping the wafer. Thus, a method according to the present invention is less complex and less expensive to implement.

Other features and advantages of the present invention will become apparent from the following description of the invention which refers to the accompanying drawings.

DETAILED DESCRIPTION OF THE FIGURES

Figure 1:
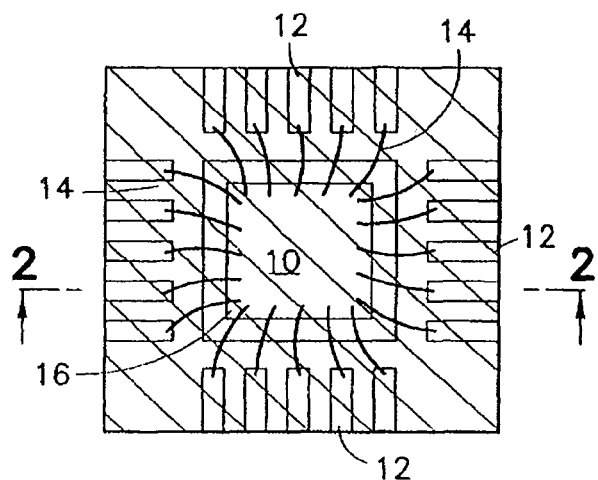
FIG. 1 shows a top plan view of a semiconductor package according to the prior art.
Figure 2:
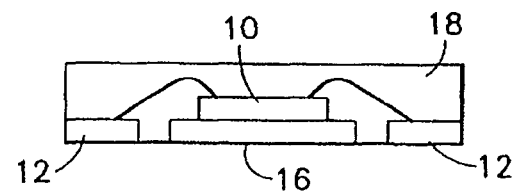
FIG. 2 shows a cross-sectional view of the package of FIG. 1 along line 2-2, viewed in the direction of the arrows.
Figure 3:
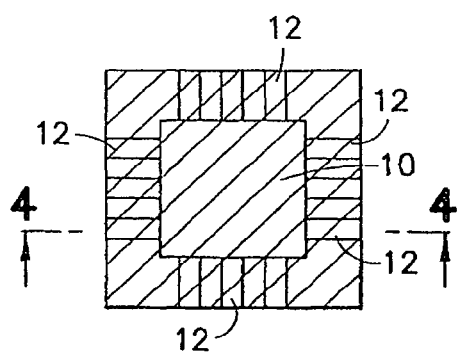
FIG. 3 shows a top plan view of another package according to the prior art.
Figure 4:
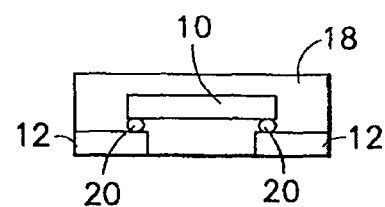
FIG. 4 shows a cross-sectional view of the package of FIG. 3 along line 4-4, viewed in the direction of the arrows.
Figure 5:
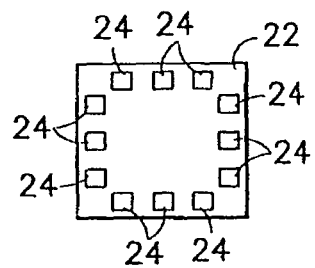
FIG. 5 shows a top plan view of an IC semiconductor device used in an embodiment of the present invention.
Figure 6:
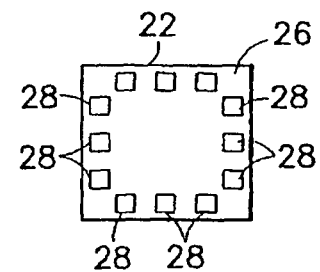
FIG. 6 shows the device of FIG. 5 after receiving a passivation body according to an aspect of the present invention.

Referring now to FIGS. 5-9, in a method according to the preferred embodiment of the present invention, a passivation body 26 (FIG. 6) is disposed on an IC semiconductor device 22 (FIG. 5) which includes I/O electrodes 24 disposed along all edges thereof. The Part No. IR3517 of International Rectifier Corporation, for example, is one such part. Passivation body 26 is preferably polymer based (e.g. an epoxy passivation) which can preferably function as a solder resist. Any suitable passivation can be used. Passivation body 26 includes an opening 28 over each electrode 24 of device 22 such that each electrode 24 is exposed.

To form a passivation body 26 as described herein, a layer of passivation material can be spread over the entire surface of device 22, and openings 28 can be formed in the layer of passivation using a conventional photolithographic process.

Alternatively, drop-on-demand deposition can be employed to form a passivation body 26 having openings 28 as described herein in a single pass, instead of a multi-step process such as photolithography. Drop-on-demand deposition is described in more detail in copending U.S. application Ser. No. 11/367,725, entitled Semiconductor Package Fabrication, Martin Standing et al., assigned to the assignee of the present application, the disclosure of which is incorporated by reference.

Figure 7:
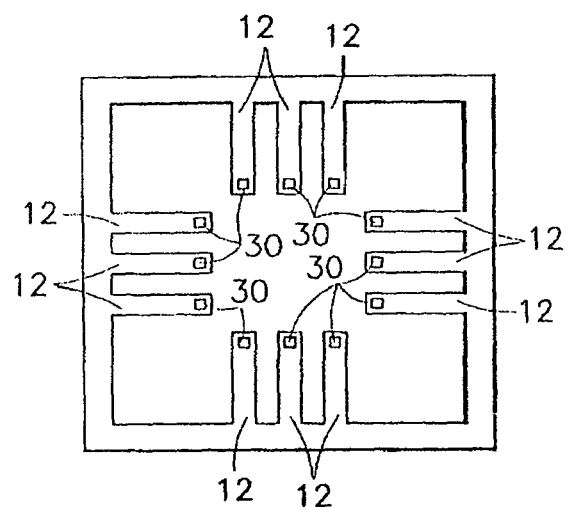
FIG. 7 shows a top plan view of a lead frame or substrate used in a package according to the present invention.

Referring now to FIG. 7, according to the present invention, conductive adhesive bodies 30 are disposed on leads 12. Conductive adhesive bodies 30 may be composed of solder or a polymer-based conductive adhesive such as silver-filled conductive epoxy. In the event solder is used as a conductive adhesive, electrodes 24 of device 22 may be rendered solderable by forming a solderable stack thereon. A suitable solderable stack may be Ti—Ni—Ag. Note that a solderable body can be plated over the exposed electrodes 24.

Figure 8:
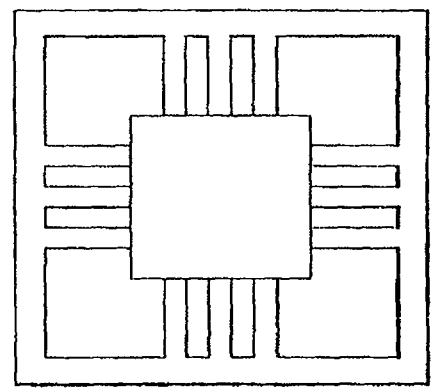
FIG. 8 shows a device according to FIG. 6 flip-mounted on the lead frame or substrate shown by FIG. 7.

Next, to flip-mount device 22 each opening 28 in passivation body 26 is aligned with a respective conductive adhesive body 30 and device 22 is mounted on the leads such that each electrode thereof is in substantial alignment with a respective conductive adhesive 30. Then, each conductive-adhesive body 30 is adhered to each electrode. Thus, when solder is used the solder bodies are reflown in a reflow step. If a conductive polymer is used, the conductive polymer is cured. In either case, a conductive adhesive body adheres a respective electrode to a respective lead, whereby each lead is mechanically and electrically connected to a respective lead. The arrangement obtained as a result of the adhering step is illustrated by FIG. 8.

Figure 9:
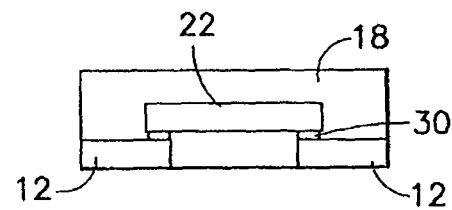
FIG. 9 shows a cross-sectional view of a package as fabricated according to the present invention.

Thereafter, device 22, conductive adhesive bodies 30, and at least portions of leads 12 are molded over with mold compound or the like, and frame 32, which supports leads 12 is trimmed to obtain a package 34, a cross-section of which is illustrated by FIG. 9.

Note that a package according to the present invention is not limited to the use of a lead frame, but that alternatively, a laminated substrate having a plurality of conductive pads for receiving conductive adhesive bodies 30 can be used instead of a lead frame having a plurality of leads without deviating from the scope and the spirit of the present invention.

Figure 10:
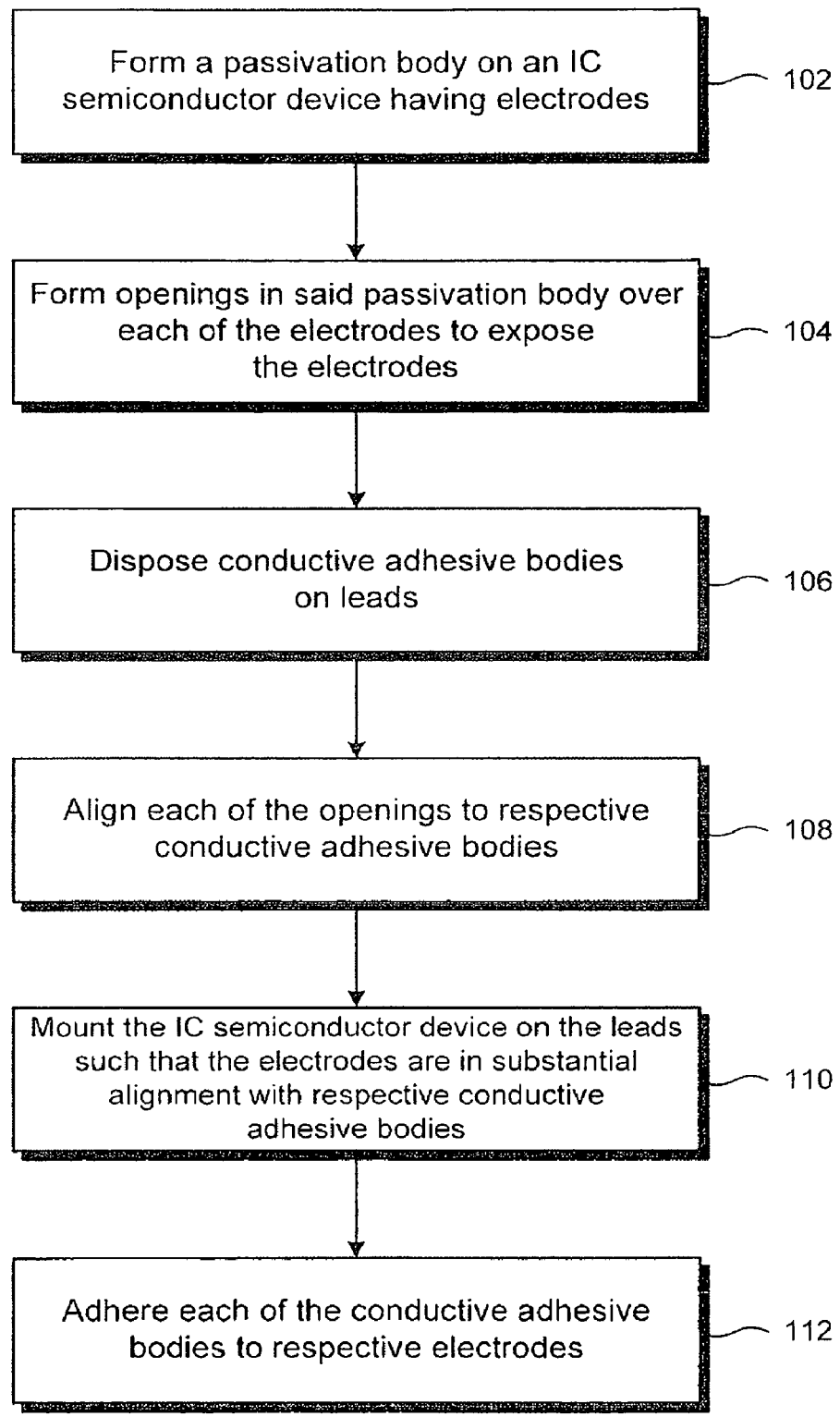
FIG. 10 shows a flowchart describing a process for fabricating a semiconductor package according to an embodiment of the present invention.

The invention's method described above is further illustrated with the aid of the flowchart in FIG. 10 as shown in blocks 102, 104, 106, 108, 110, and 112 of FIG. 10.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for fabricating a semiconductor package, comprising:
   disposing a passivation body over a plurality of electrodes of an IC semiconductor device;
   removing a portion of said passivation body to define an opening over each of the plurality of electrodes of said IC semiconductor device;
   depositing a conductive adhesive body on a plurality of conductive leads;
   aligning each said opening with a respective adhesive body;
   placing said IC semiconductor device over said conductive adhesive bodies with each said opening in alignment with said respective adhesive body; and
   adhering each adhesive body to a respective electrode of the plurality of electrodes of said IC semiconductor device.

2. The method of claim 1, wherein said IC semiconductor device includes a plurality of edges, and wherein said plurality of electrodes is disposed over at least each edge of said plurality of edges.

3. The method of claim 1, wherein said passivation body comprises an epoxy.

4. The method of claim 1, wherein said passivation body includes solder resist characteristics.

5. The method of claim 1, wherein said conductive adhesive bodies are comprised of solder, and are adhered to said plurality of electrodes in a reflow step.

6. The method of claim 1, wherein said conductive adhesive bodies are comprised of a conductive polymer, and are adhered to said plurality of electrodes in a curing step.

7. The method of claim 1, wherein said leads comprise a lead frame.

8. The method of claim 1, wherein said leads are included in a laminate substrate.

9. The method of claim 1, wherein said leads are arranged at least on a bottom surface of said IC semiconductor device.

10. The method of claim 1, further comprising molding over said IC semiconductor device and at least portions of said leads with a mold compound.

11. A method for fabricating a semiconductor package, comprising:
    forming a passivation body having a plurality of openings lining up over each electrode of an IC semiconductor device;
    depositing a conductive adhesive body on a plurality of conductive leads;
    aligning each said plurality of openings with a respective adhesive body;
    placing said IC semiconductor device over said conductive adhesive bodies with each said plurality of openings in alignment with said respective adhesive body; and
    adhering each adhesive body to a respective electrode of said IC semiconductor device.

12. The method or claim 11, wherein said IC semiconductor device includes said electrodes at an edge thereof or underneath a bottom surface of said device.

13. The method of claim 11, wherein said passivation body comprises an epoxy.

14. The method of claim 13, wherein said passivation body includes solder resist characteristics.

15. The method of claim 11, wherein said conductive adhesive bodies are comprised of solder, and are adhered to said electrodes in a reflow step.

16. The method of claim 11, wherein said conductive adhesive bodies are comprised of a conductive polymer, and are adhered to said electrodes in a curing step.

17. The method of claim 11, wherein said leads comprise a lead frame.

18. The method of claim 11, wherein said leads are included in a laminate or ceramic substrate.

19. The method of claim 11, wherein said leads are arranged to surround said IC semiconductor device.

20. The method of claim 11, further comprising molding over said IC semiconductor device and at least portions of said leads with a mold compound.

21. The method of claim 11, wherein said passivation body is drop-on-demand deposited whereby said plurality of openings are defined during the deposition of said passivation body.

* * * * *